United States Patent [19]
Furukawa et al.

[11] Patent Number: 5,814,871
[45] Date of Patent: Sep. 29, 1998

[54] OPTICAL SEMICONDUCTOR ASSEMBLY HAVING A CONDUCTIVE FLOAT PAD

[75] Inventors: Hiroyuki Furukawa, Sapporo; Hironao Hakogi; Yoshio Shimano, both of Kawasaki, all of Japan

[73] Assignee: Fujitsu Ltd., Kawasaki, Japan

[21] Appl. No.: 789,663

[22] Filed: Jan. 27, 1997

[30] Foreign Application Priority Data

Aug. 15, 1996 [JP] Japan ................................. 8-215816

[51] Int. Cl.⁶ ................. H01L 31/0232; H01L 31/0203; H01L 33/00
[52] U.S. Cl. .................. 257/433; 257/432; 257/678; 257/99; 438/16
[58] Field of Search ...................... 257/433, 431, 257/678, 680, 698–703, 705, 706, 723, 729, 733, 734, 432, 99, 100, 666; 438/7, 15, 25–27, 16, 17

[56] References Cited

U.S. PATENT DOCUMENTS

| | | | |
|---|---|---|---|
| 4,032,964 | 6/1977 | Boeters | 257/780 |
| 4,128,801 | 12/1978 | Gansert et al. | 257/701 |
| 4,307,934 | 12/1981 | Palmer | 257/433 |
| 4,316,204 | 2/1982 | Inagaki et al. | 257/433 |
| 4,768,070 | 8/1988 | Takizawa et al. | 257/82 |
| 5,212,699 | 5/1993 | Masuko et al. | 257/678 |
| 5,252,856 | 10/1993 | Muai | 257/678 |
| 5,550,675 | 8/1996 | Komatsu | 257/99 |
| 5,610,395 | 3/1997 | Nishiyama | 257/433 |

FOREIGN PATENT DOCUMENTS

| | | | |
|---|---|---|---|
| 55-13963 | 1/1980 | Japan | 257/431 |
| 1-141039 | 6/1989 | Japan | 257/433 |
| 4-365381 | 12/1992 | Japan | 257/433 |

Primary Examiner—Mahshid D. Saadat
Assistant Examiner—Jhihan B. Clark
Attorney, Agent, or Firm—Staas & Halsey

[57] ABSTRACT

An optical semiconductor assembly including a metal stem, a hermetic glass substrate fixed to the stem, and a conductive float pad formed on the hermetic glass substrate. The first to third leads are mounted to the stem so as to be insulated from the stem and pass through the stem. An optical semiconductor element is mounted on a lead head of the third lead, and a bare chip IC is mounted on the stem. By using the float pad, screening of the optical semiconductor element is performed during assembly. After completing the assembly, the characteristics of the assembly are checked to thereby perform screening of the bare chip IC. Thus, two independent steps of screening are performed, so that improvement in yield of the completed products can be expected.

8 Claims, 12 Drawing Sheets

OPTICAL SEMICONDUCTOR ASSEMBLY HAVING A CONDUCTIVE FLOAT PAD

BACKGROUND OF THE INVENTION

1. Field of the Invention

The present invention relates to an optical semiconductor assembly such as a photodetector package.

2. Description of the Related Art

With a rapid growth of multimedia industries, a need of intent to transmit high-capacity information at high speeds is increasing. Also in view of a market move, not only the rate of increase in output of low-and-medium-speed transmission devices as a main stream rises, but also an increase in output of high-speed transmission devices is remarkable. Components of the high-speed transmission devices are required to have electromagnetic characteristics and high-frequency characteristics specific to a high-speed system because of its high transmission rate. Accordingly, optical components of the high-speed transmission devices require complicated design in general, causing a low productivity and high cost.

It is essential for an optical receiver to have a package structure of integrated preamplifier and photodiode in order to improve transmission characteristics. The reason for this package structure is that an input capacity to the preamplifier can be reduced by connecting the photodiode and the preamplifier at close positions. Further, there is a merit such that the photodiode and the preamplifier can be shielded from external noise such as electromagnetic noise by accommodating them in the same package. Thus, the transmission characteristics can be improved by accommodating the photodiode and the preamplifier in the same package.

A butterfly type optical semiconductor module employing a chip carrier is known. The chip carrier is formed from a ceramic block. A metallized electrode and a float pad are provided on the ceramic block, and an avalanche photodiode chip (APD chip) is mounted on the metallized electrode. The APD chip is connected to the float pad by a bonding wire.

Screening of the APD chip in its bare chip condition is difficult, and characteristics of the APD chip change in its mounting step. Accordingly, the screening of the APD chip must be performed after mounting. For this reason, the screening of the APD chip is conventionally performed in the condition where it is assembled with the chip carrier, and defectives of the APD chip are rejected in advance. Thereafter, the chip carrier is mounted on a substrate on which electric components have been mounted, and the APD chip is electrically connected through the float pad to a preamplifier IC. After hermetically sealing all the components, an optical fiber is aligned in optical axis with the APD chip, and the optical fiber is fixed, thus completing an optical semiconductor module.

Since the photodiode and the preamplifier IC are semiconductor components, satisfying high-speed characteristics of these components cause a great reduction in yields thereof. As a result, screening of the photodiode and the preamplifier IC after assembling them together causes an increase in frequency of rejections of defectives of these components. In particular, a high-speed transmission system requiring a high gain frequently employs the APD chip which has multiplication characteristics. However, since the characteristics of the APD chip are affected by the packaging process, the screening of the APD chip in its bare chip condition is difficult. Accordingly, the screening of the APD chip must be performed after mounting it on a stem or the like.

The screening of the APD chip must be performed at a peripheral temperature of 200° C. or higher. Accordingly, it is difficult to perform the screening of the APD chip combined with the preamplifier IC. For this reason, at present, the screening of the APD chip is performed in the condition where it is mounted on the chip carrier as mentioned above, and thereafter the optical semiconductor module is completed. However, the use of the chip carrier constitutes a large limitation on characteristics and structure of the module.

That is, the conventional butterfly type optical semiconductor module employs the chip carrier, so that a large mounting area is required, causing an increase in module size. Further, since the chip carrier is supplied with current through a prober electrode, the size of the float pad becomes large. As a result, the pad capacity becomes large to adversely affect noise characteristics and transmission characteristics such as a waveform. Further, the distance between the APD chip and the preamplifier IC is long because they are interconnected by the float pad, causing an adverse effect on transmission characteristics like the pad capacity. Also in consideration of productivity and cost, the conventional butterfly type optical semiconductor module has problems in cost and structure such that the workability in hermetic sealing and alignment of the optical axis of the optical fiber is low.

SUMMARY OF THE INVENTION

It is therefore an object of the present invention to provide an optical semiconductor assembly which can reduce the incidence of defectives after assembly.

It is another object of the present invention to provide an optical semiconductor assembly which can satisfy high-speed characteristics and can be manufactured with a small size at a low cost.

In accordance with an aspect of the present invention, there is provided an optical semiconductor assembly comprising a metal stem; first and second leads provided so as to be insulated from the stem and pass through the stem; a hermetic glass substrate fixed on the stem; a conductive float pad provided on the hermetic glass substrate; a third lead provided so as to be insulated from the stem and pass through the hermetic glass substrate and the stem, the third lead having a lead head; an optical semiconductor element mounted on the lead head of the third lead; a bare chip integrated circuit mounted on the stem; a first bonding wire for connecting the optical semiconductor element and the float pad; a second bonding wire for connecting the float pad and the bare chip integrated circuit; a third bonding wire for connecting the bare chip integrated circuit and the first lead; and a fourth bonding wire for connecting the bare chip integrated circuit and the second lead.

Preferably, the conductive float pad is printed on the hermetic glass substrate. Alternatively, a hole may be formed in the hermetic glass substrate, and a metal block functioning as the float pad may be inserted and fixed in the hole.

In accordance with another aspect of the present invention, there is provided an optical semiconductor assembly comprising a metal stem; first and second leads provided so as to be insulated from the stem and pass through the stem; a ceramic block fixed on the stem; a conductive float pad provided on the ceramic block; a third lead provided so as to be insulated from the stem and pass through the stem, the third lead having a lead head; an optical semiconductor element mounted on the lead head of the third lead; a bare chip integrated circuit mounted on the stem; a first bonding wire for connecting the optical semiconductor element and the float pad; a second bonding wire for connecting the float pad and the bare chip integrated circuit; a third bonding wire for connecting the bare chip integrated circuit and the first lead; and a fourth bonding wire for connecting the bare chip integrated circuit and the second lead.

In accordance with a further aspect of the present invention, there is provided an assembling method for an optical semiconductor assembly, comprising the steps of preparing a metal stem; mounting first and second leads to the stem so that the first and second leads are insulated from the stem and pass through the stem; mounting a third lead having a lead head to the stem so that the third lead is insulated from the stem and pass through the stem; mounting an optical semiconductor element on the lead head of the third head; forming a conductive float pad on the stem so that the conductive float pad is insulated from the stem; connecting the first lead and the float pad through a first bonding wire; connecting the float pad and the optical semiconductor element through a second bonding wire; applying a given voltage between the first lead and the third lead to perform screening of the optical semiconductor element; cutting the first bonding wire; mounting a bare chip integrated circuit on the stem; connecting the bare chip integrated circuit and the first lead, second lead and the float pad through bonding wires, respectively; and performing screening of the bare chip integrated circuit.

According to the assembling method of the present invention, the screening of the optical semiconductor element and the screening of the bare chip integrated circuit are performed independently of each other. Therefore, the incidence of defectives of the completed optical semiconductor assembly can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
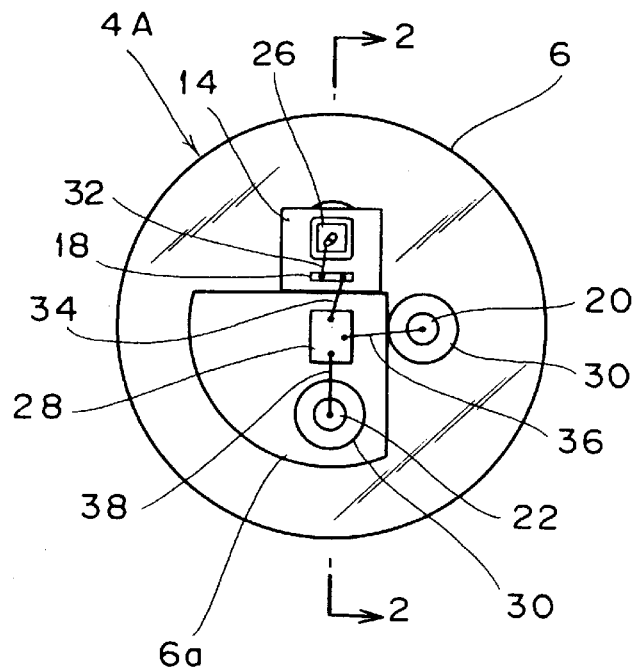
FIG. 1 is a plan view of a first preferred embodiment of the present invention.

An optical semiconductor assembly according to a first preferred embodiment of the present invention will now be described with reference to FIGS. 1 to 3. Reference numeral 4A denotes an optical semiconductor assembly such as a photodetector package, which has a metal stem 6 formed of Kovar. As best shown in FIG. 3, the metal stem 6 has a projecting portion 6a having a flat upper surface, and is formed with three through holes 8, 10, and 12. Reference numeral 14 denotes a green sheet of a hermetic glass substrate, which is formed with a through hole 16. A float pad 18 formed of Kovar is printed on the green sheet 14.

Sealing glass is attached on the outer circumferences of leads 20 and 22, and the leads 20 and 22 are then inserted into the through holes 8 and 10, respectively. A lead 24 has a lead head 24a having a flat upper surface. Sealing glass is also attached on the outer circumference of the lead 24, and the lead 24 is then inserted into the through hole 16 of the green sheet 14. In this condition, the green sheet 14 is mounted on the metal stem 6, and the lead 24 is inserted into the through hole 12. The green sheet 14 of the hermetic glass substrate has a melting point higher than that of the sealing glass. Accordingly, when sintering is carried out in this condition, the sealing glass is molten to seal the through holes 8, 10, 12, and 16, and the hermetic glass substrate 14 is integrated with the metal stem 6 by sintering. Thus, the gaps between the outer circumferences of the leads 20, 22, and 24 and the stem 6 are hermetically sealed with sintered glass 30 as shown in FIGS. 1 and 2, thereby insulating the leads 20, 22, and 24 from the stem 6. After sintering, the float pad 18 and the metal stem 6 are plated with gold.

Figure 2:
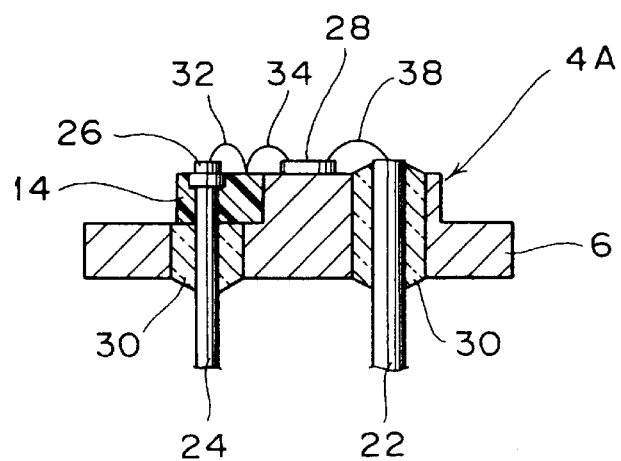
FIG. 2 is a cross section taken along the line 2—2 in FIG. 1.
Figure 3:
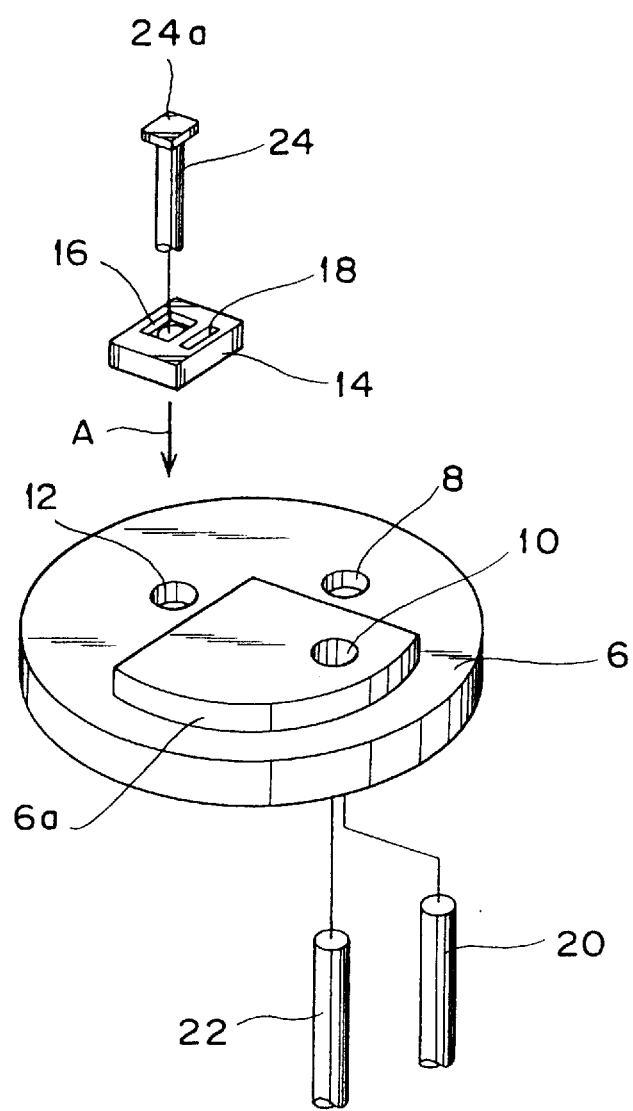
FIG. 3 is an exploded perspective view of the first preferred embodiment, showing an assembling method.

As shown in FIGS. 1 and 2, an APD chip 26 is die-bonded on the lead head 24a of the lead 24, and a preamplifier IC 28 is die-bonded on the projecting portion 6a of the stem 6. The APD chip 26 is connected to the float pad 18 by a bonding wire 32 such as a gold wire. The float pad 18 is connected to the preamplifier IC 28 by a bonding wire 34. The preamplifier IC 28 is connected to the leads 20 and 22 respectively by bonding wires 36 and 38.

Figure 17:
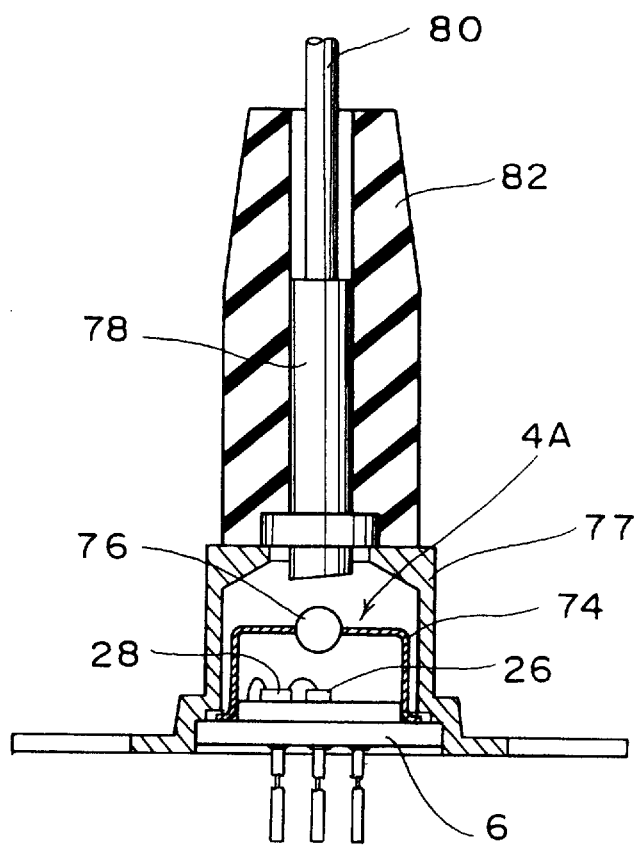
FIG. 17 is a sectional view of a photodetector module.

The lead 20 is a power terminal for supplying a supply voltage. The lead 22 is a signal terminal for taking out a signal detected by the APD chip 26. The lead 24 is a bias terminal for supplying a bias voltage to the APD chip 26. A cap 74 having a lens 76 as shown in FIG. 17 is mounted on the stem 6 in the condition shown in FIGS. 1 and 2 to hermetically seal the inside of the cap 74, thus completing the photodetector package 4A.

As apparent from FIG. 1, the APD chip 26 and the preamplifier IC 28 are not directly connected, but are connected through the float pad 18. The reason for this arrangement will now be described. As mentioned previously, the characteristics of the APD chip are largely affected by a packaging process, so that it is difficult to screen the APD chip in its bare chip condition. Accordingly, screening must be performed after packaging. A screening method according to the present invention will now be described with reference to FIGS. 4A to 4D. In FIGS. 4A to 4D, substantially the same parts as those in the first preferred embodiment shown in FIGS. 1 to 3 are denoted by the same reference numerals.

Figure 4A:
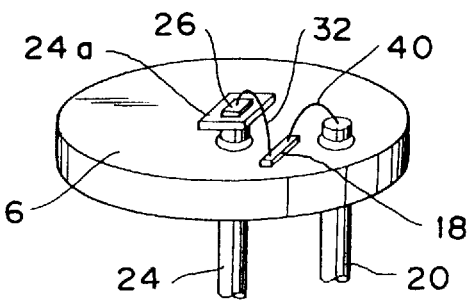
FIGS. 4A to 4D are perspective views illustrating a screening method according to the present invention.

As shown in FIG. 4A, a float pad 18 in an electrically floating condition is provided on a metal stem 6. An APD chip 26 mounted on a lead head 24a of a lead 24 is connected to the float pad 18 by a bonding wire 32, and a lead 20 is connected to the float pad 18 by a bonding wire 40. In this condition, a given voltage is applied between the leads 20 and 24 to screen the APD chip 26, that is, reject defectives of the APD chip 26. Thereafter, the bonding wire 40 connecting the float pad 18 and the lead 20 is removed as shown by a broken line in FIG. 4B.

Figure 4B:
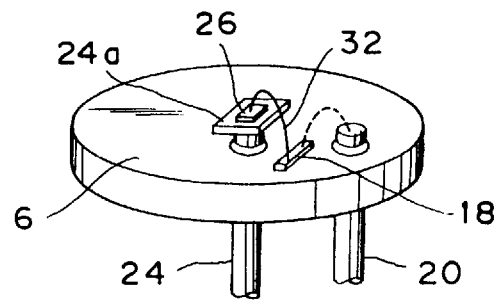
Figure 4C:
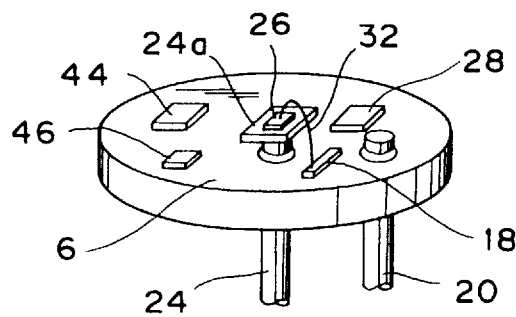
Figure 4D:
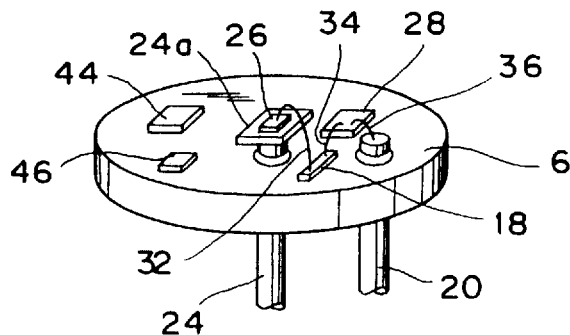

In the next step, a preamplifier IC 28 and electronic components 44 and 46 such as a chip capacitor are mounted on the stem 6 as shown in FIG. 4C. Then, the preamplifier IC 28 and the float pad 18 are connected by a bonding wire 34, and the preamplifier IC 28 and the lead 20 are connected by a bonding wire 36 as shown in FIG. 4D. Thereafter, a cap 74 having a lens 76 as shown in FIG. 17 is mounted on the stem 6 to hermetically seal the inside of the cap 74 by projection welding, thus completing a photodetector package.

In the completed condition of the photodetector package, the characteristics of the preamplifier IC 28 is checked to perform screening thereof. That is, the screening of the preamplifier IC 28 is performed by directing light through the lens of the photodetector package onto the APD chip 26 and monitoring a voltage from the signal terminal. In this manner, the screening method according to the present invention is composed of two steps. Therefore, defectives of the APD chip 26 can be found before it is combined with the preamplifier IC 28, so that improvement in yield of the assembled photodetector module can be expected. After screening of the APD chip 26 as shown in FIG. 4B, the bonding wire 32 is not cut, but the APD chip 26 and the preamplifier IC 28 are connected through the float pad 18. The reason for this method is that if the bonding wire 32 is cut, the characteristics of the APD chip 26 are changed.

Figure 5:
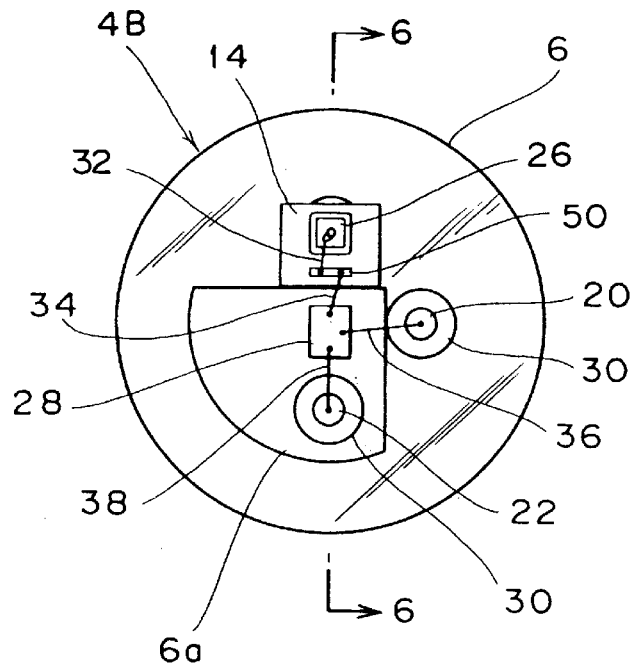
FIG. 5 is a plan view of a second preferred embodiment of the present invention.
Figure 6:
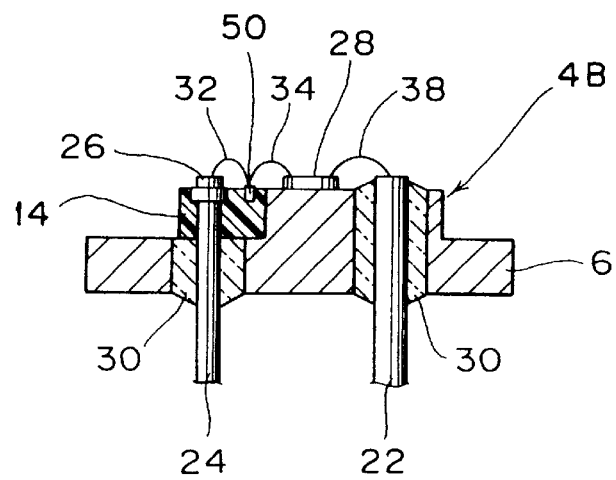
FIG. 6 is a cross section taken along the line 6—6 in FIG. 5.
Figure 7:
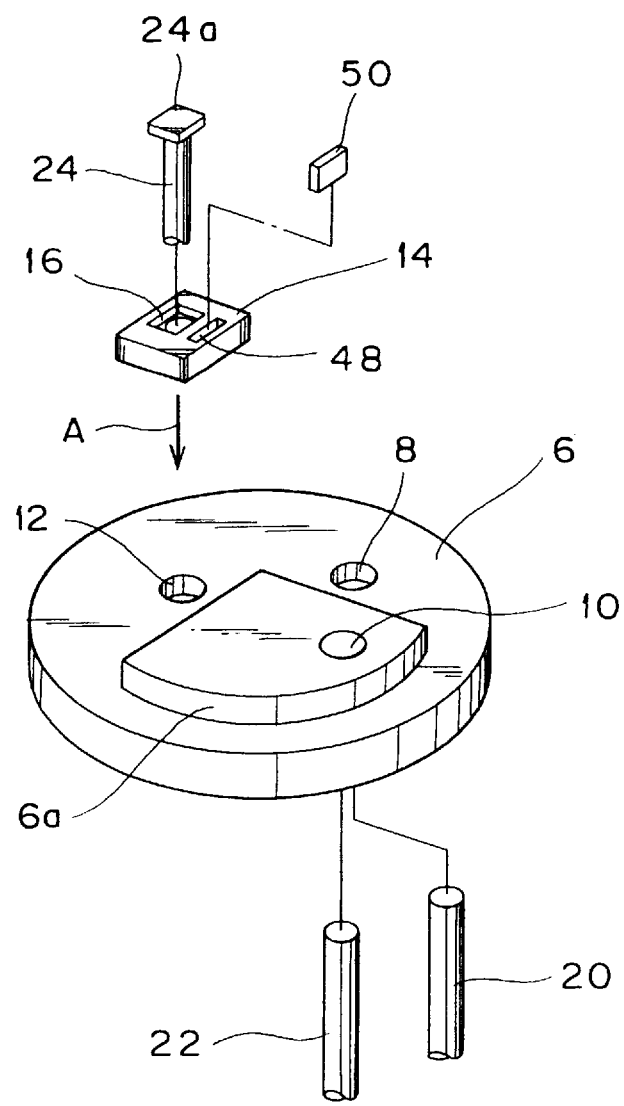
FIG. 7 is an exploded perspective view of the second preferred embodiment, showing an assembling method.

A photodetector package 4B according to a second preferred embodiment of the present invention will now be described with reference to FIGS. 5 to 7. In the following description of this preferred embodiment, substantially the same parts as those in the first preferred embodiment mentioned above will be denoted by the same reference numerals, and the description thereof will be omitted to avoid repetition. In the second preferred embodiment, a hole 48 is formed in a green sheet of a hermetic glass substrate 14, and a metal block 50 formed of Kovar is inserted in the hole 48. In this condition, the green sheet of the hermetic glass substrate 14 is sintered to be integrated with a metal stem 6. The metal block 50 functions as an electrically floating pad. By the use of the metal block 50, the screening of an APD chip 26 can be performed during assembly of the photodetector package 4B as similar to the first preferred embodiment.

Figure 8:
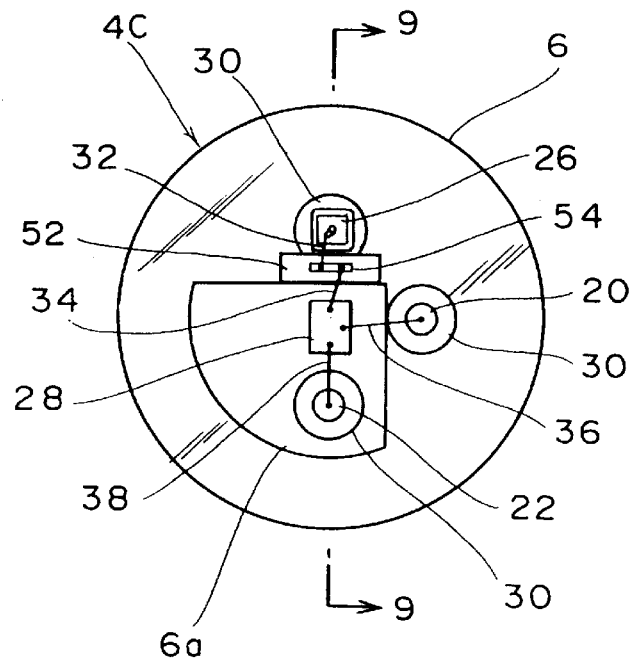
FIG. 8 is a plan view of a third preferred embodiment of the present invention.
Figure 9:
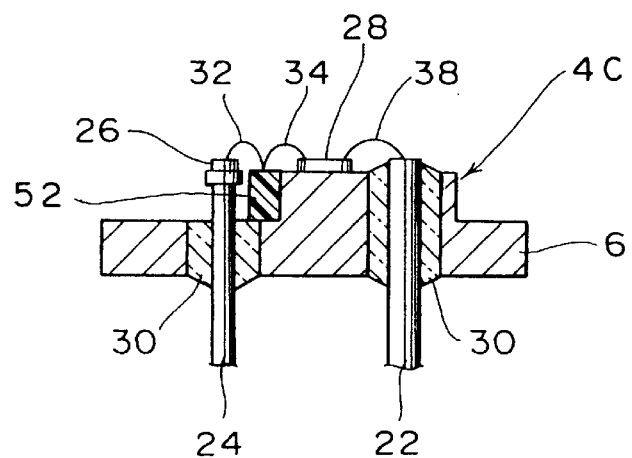
FIG. 9 is a cross section taken along the line 9—9 in FIG. 8.
Figure 10:
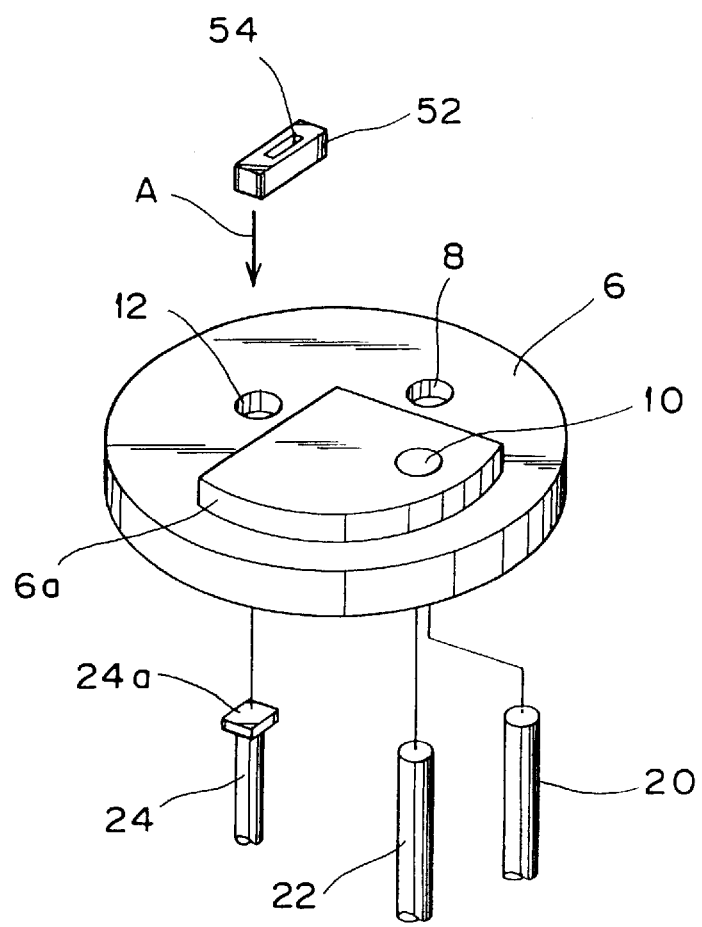
FIG. 10 is an exploded perspective view of the third preferred embodiment, showing an assembling method.

Referring to FIGS. 8 to 10, there is shown a photodetector package 4C according to a third preferred embodiment of the present invention. In the following description of this preferred embodiment, substantially the same parts as those in the first preferred embodiment mentioned above will be denoted by the same reference numerals, and the description thereof will be omitted to avoid repetition. As best shown in FIG. 10, a gold plating pattern 54 is formed on a ceramic block 52. The gold plating pattern 54 is used as an electrically floating pad. The ceramic block 52 is fixed to a metal stem 6 by brazing. Also in this preferred embodiment, by the use of the gold plating pattern 54 as the float pad, the screening of an APD chip 26 can be performed during assembly of the photodetector package 4C.

Figure 11:
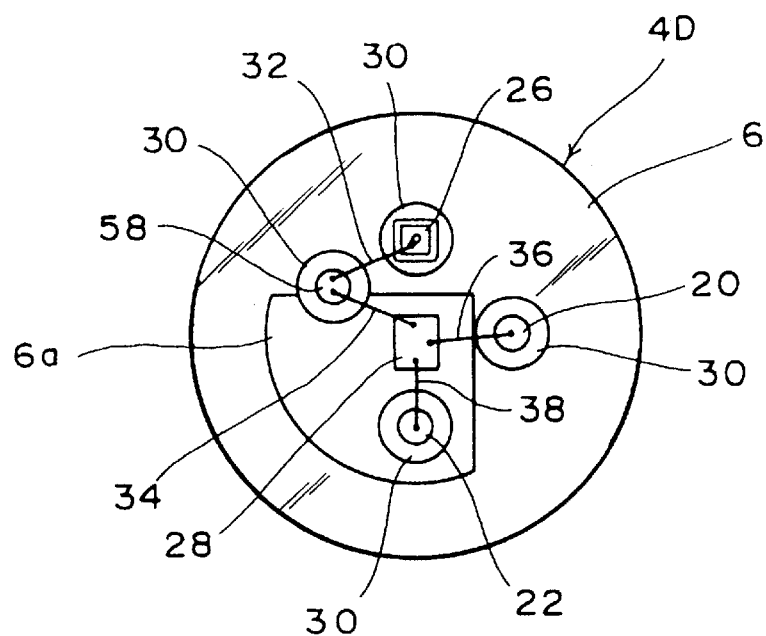
FIG. 11 is a plan view of a fourth preferred embodiment of the present invention.
Figure 12:
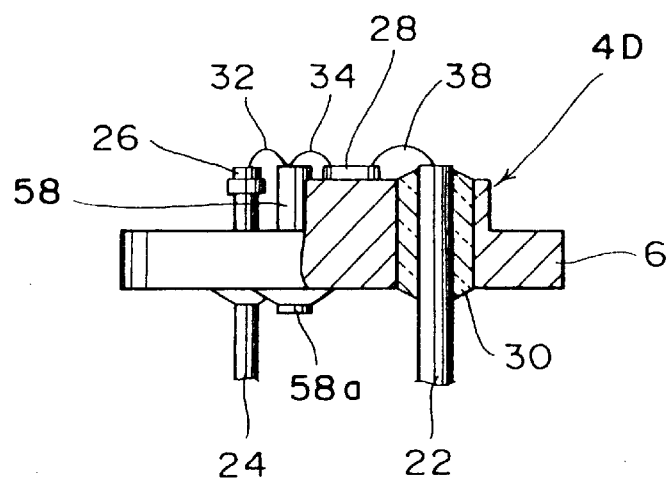
FIG. 12 is a partially sectional, side view of FIG. 11.
Figure 13:
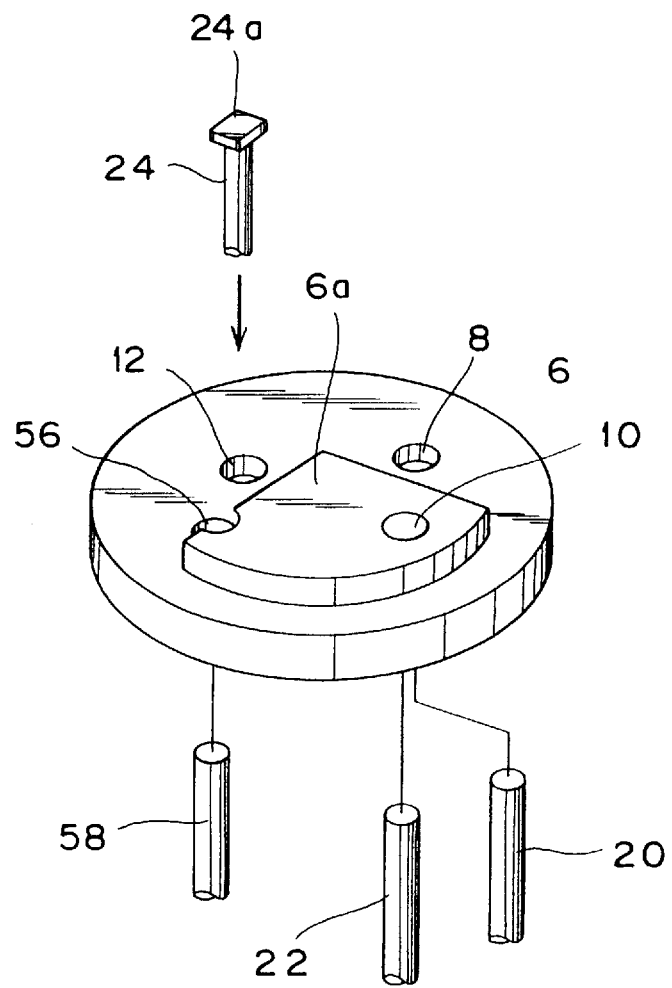
FIG. 13 is an exploded perspective view of the fourth preferred embodiment, showing an assembling method.

Referring to FIGS. 11 to 13, there is shown a photodetector package 4D according to a fourth preferred embodiment of the present invention. In the following description of this preferred embodiment, substantially the same parts as those in the first preferred embodiment mentioned above will be denoted by the same reference numerals, and the description thereof will be omitted to avoid repetition. In this preferred embodiment, the float pad used in each of the first to third preferred embodiments is replaced by a lead 58 for screening. In performing the screening of an APD chip 26, the APD chip 26 and the lead 58 are connected by a bonding wire 32, and the lead 58 and a lead 20 are connected by a bonding wire (not shown). After finishing the screening of the APD chip 26, the lead 58 is cut as shown by 58a in FIG. 12. Also in this preferred embodiment, by the use of the lead 58 for screening, the screening of the APD chip 26 can be performed during assembly of the photodetector package 4D as similar to the first to third preferred embodiments.

Figure 14:
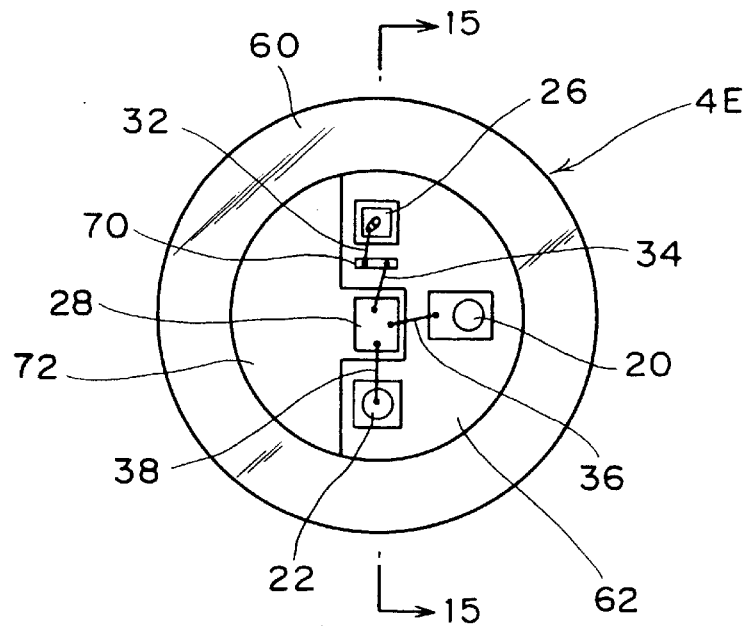
FIG. 14 is a plan view of a fifth preferred embodiment of the present invention.
Figure 15:
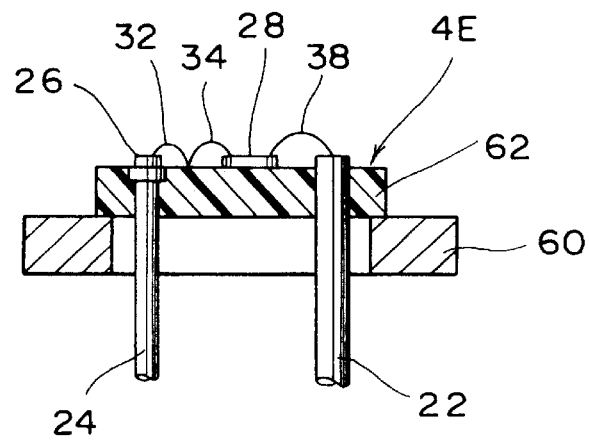
FIG. 15 is a cross section taken along the line 15—15 in FIG. 14.
Figure 16:
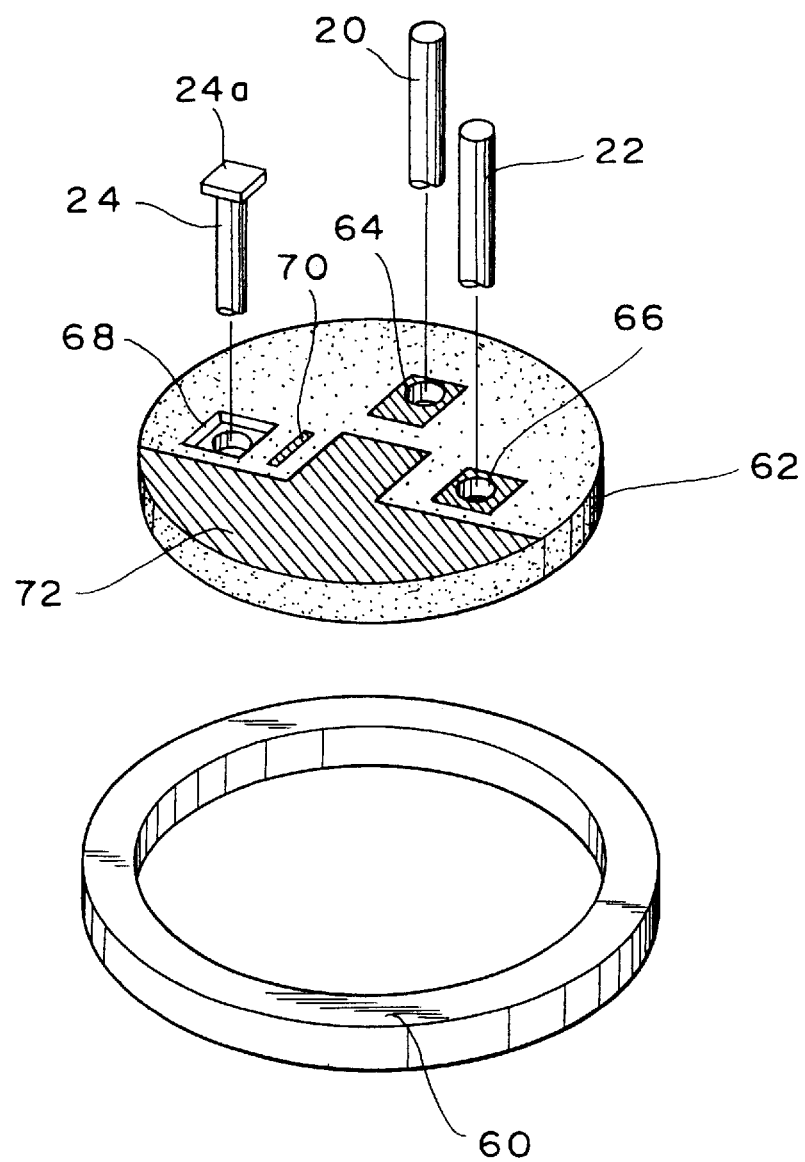
FIG. 16 is an exploded perspective view of the fifth preferred embodiment, showing an assembling method.

Referring to FIGS. 14 to 16, there is shown a photodetector package 4E according to a fifth preferred embodiment of the present invention. In the following description of this preferred embodiment, substantially the same parts as those in the first preferred embodiment mentioned above will be denoted by the same reference numerals, and the description thereof will be omitted to avoid repetition. As best shown in FIG. 16, a disk-shaped ceramic substrate 62 is formed with three through holes 64, 66, and 68 respectively for insertion of leads 20, 22, and 24. A gold plating pattern 72 for connection of components is formed on the ceramic substrate 62, and a conductive float pad 70 is also formed on the ceramic substrate 62 by gold plating.

The ceramic substrate 62 is brazed to a ring-shaped metal stem 60. The leads 20, 22, and 24 are inserted into the through holes 64, 66, and 68, respectively, and are brazed to the ceramic substrate 62. Also in this preferred embodiment, by the use of the float pad 70, the screening of an APD chip 26 can be performed during assembly of the photodetector package 4E.

Referring to FIG. 17, there is shown a sectional view of a photodetector module incorporating the photodetector package 4A of the first preferred embodiment. The photodetector package 4A is housed in a package holder 77. An optical fiber 80 is inserted and fixed in a ferrule 78. After aligning the optical axes of the optical fiber 80 and the photodetector package 4A, the ferrule 78 is fixed to the package holder 77. Reference numeral 82 denotes a protective cover formed of rubber.

According to the optical semiconductor assembly of the present invention, the float pad is provided on the metal stem. Accordingly, at least one of a plurality of semiconductor elements mounted can be screened during assembly, so that it is possible to provide an optical semiconductor assembly which can reduce the incidence of defectives after assembly.

Since the two independent steps of screening are performed, the yield can be greatly improved and a cost reduction of the optical semiconductor assembly can be expected. Further, since the stem itself as a part of the package serves as a chip carrier, the optical semiconductor assembly can be reduced in size.

What is claimed is:

1. An optical semiconductor assembly comprising:
   a metal stem;
   first and second leads provided so as to be insulated from said stem and pass through said stem;
   a hermetic glass substrate fixed on said stem;
   a conductive float pad provided on said hermetic glass substrate;
   a third lead provided so as to be insulated from said stem and pass through said hermetic glass substrate and said stem, said third lead having a lead head;
   an optical semiconductor element mounted on said lead head of said third lead;
   a bare chip integrated circuit mounted on said stem;
   a first bonding wire for connecting said optical semiconductor element and said float pad;
   a second bonding wire for connecting said float pad and said bare chip integrated circuit;
   a third bonding wire for connecting said bare chip integrated circuit and said first lead; and
   a fourth bonding wire for connecting said bare chip integrated circuit and said second lead.

2. An optical semiconductor assembly according to claim 1, wherein said conductive float pad is printed on said hermetic glass substrate.

3. An optical semiconductor assembly according to claim 1, wherein said hermetic glass substrate has a hole, and said conductive float pad comprises a metal block inserted and fixed in said hole.

4. An optical semiconductor assembly according to claim 1, wherein said optical semiconductor element comprises a photodetector, and said bare chip integrated circuit comprises a preamplifier integrated circuit.

5. An optical semiconductor assembly comprising:
   a metal stem;
   first and second leads provided so as to be insulated from said stem and pass through said stem;
   a ceramic block fixed on said stem;
   a conductive float pad provided on said ceramic block;
   a third lead provided so as to be insulated from said stem and pass through said stem, said third lead having a lead head;
   an optical semiconductor element mounted on said lead head of said third lead;
   a bare chip integrated circuit mounted on said stem;
   a first bonding wire for connecting said optical semiconductor element and said float pad;
   a second bonding wire for connecting said float pad and said bare chip integrated circuit;
   a third bonding wire for connecting said bare chip integrated circuit and said first lead; and
   a fourth bonding wire for connecting said bare chip integrated circuit and said second lead.

6. An optical semiconductor assembly according to claim 5, wherein said ceramic block is brazed on said metal stem, and said conductive float pad is formed by gold plating.

7. An optical semiconductor assembly comprising:
   a metal stem;
   a ceramic substrate fixed to said metal stem, said ceramic substrate having first, second, and third through holes, and also having a metallized portion;
   first and second leads inserted and fixed in said first and second through holes, respectively;
   a third lead inserted and fixed in said third through hole, said third lead having a lead head;
   an optical semiconductor element mounted on said lead head of said third lead;
   a conductive float pad provided on said ceramic substrate;
   a bare chip integrated circuit mounted on said metallized portion of said ceramic substrate;
   a first bonding wire for connecting said optical semiconductor element and said float pad;
   a second bonding wire for connecting said float pad and said bare chip integrated circuit;
   a third bonding wire for connecting said bare chip integrated circuit and said first lead; and
   a fourth bonding wire for connecting said bare chip integrated circuit and said second lead.

8. An optical semiconductor assembly according to claim 7, wherein said metal stem is ring-shaped, and said ceramic substrate is disk-shaped and brazed to said ring-shaped stem.

* * * * *